US012096586B2

(12) United States Patent
Ogata et al.

(10) Patent No.: US 12,096,586 B2
(45) Date of Patent: Sep. 17, 2024

(54) INSTALLATION STRUCTURE OF HIGH VOLTAGE ELECTRICAL UNIT ON VEHICLE

(71) Applicant: Nissan Motor Co., Ltd., Kanagawa (JP)

(72) Inventors: Kenichi Ogata, Kanagawa (JP); Yasuaki Nakamura, Kanagawa (JP); Atsushi Horiguchi, Kanagawa (JP); Kohei Yamada, Kanagawa (JP); Norihisa Tsujimura, Kanagawa (JP); Yasuhiro Tosaka, Kanagawa (JP); Shunsuke Ehara, Kanagawa (JP)

(73) Assignee: Nissan Motor Co., Ltd., Kanagawa (JP)

( * ) Notice: Subject to any disclaimer, the term of this patent is extended or adjusted under 35 U.S.C. 154(b) by 0 days.

(21) Appl. No.: 17/631,756

(22) PCT Filed: Apr. 5, 2021

(86) PCT No.: PCT/JP2021/014476
§ 371 (c)(1),
(2) Date: Oct. 13, 2022

(87) PCT Pub. No.: WO2022/215111
PCT Pub. Date: Oct. 13, 2022

(65) Prior Publication Data
US 2024/0023267 A1 Jan. 18, 2024

(51) Int. Cl.
*H02B 1/48* (2006.01)
*B60L 50/50* (2019.01)
*B62D 25/20* (2006.01)
*H05K 7/14* (2006.01)

(52) U.S. Cl.
CPC .......... *H05K 7/14325* (2022.08); *B60L 50/50* (2019.02); *B62D 25/20* (2013.01); *H02B 1/48* (2013.01); *H05K 7/14339* (2022.08); *B60L 2210/10* (2013.01)

(58) Field of Classification Search
None
See application file for complete search history.

(56) References Cited

U.S. PATENT DOCUMENTS 7,644,978 B2 * 1/2010 Tosaka ................... B60N 2/005
296/193.07
10,109,894 B2 * 10/2018 Tsujimura ................ B60K 1/04
(Continued)

FOREIGN PATENT DOCUMENTS

JP 2007-335202 A 12/2007
JP 2013-095182 A 5/2013
(Continued)

*Primary Examiner* — Courtney L Smith
(74) *Attorney, Agent, or Firm* — Osha Bergman Watanabe & Burton LLP

(57) ABSTRACT

A high voltage electrical unit is installed above a floor of a vehicle between left and right seats. A bracket is fixed on the floor between the left and right seats, and the high voltage electrical unit is fixed on a bracket top plate of the bracket. A protect cover for covering the high voltage electrical unit is fixed on the bracket. Strength of the protect cover against a lateral load is made higher than strength of the bracket against the lateral load.

9 Claims, 4 Drawing Sheets

(56) References Cited

U.S. PATENT DOCUMENTS

| | | | |
|---|---|---|---|
| 2009/0167077 A1* | 7/2009 | Tsuchiya | B60L 50/60 |
| | | | 307/9.1 |
| 2010/0013268 A1* | 1/2010 | Roccato | B62D 21/157 |
| | | | 296/187.08 |
| 2017/0087972 A1* | 3/2017 | Hara | B60K 1/04 |
| 2017/0365897 A1* | 12/2017 | Okada | H01M 10/625 |
| 2020/0231098 A1 | 7/2020 | Takenaga et al. | |
| 2022/0315112 A1* | 10/2022 | Kawase | B62D 21/15 |
| 2023/0226929 A1* | 7/2023 | Kunimitsu | H01M 10/46 |
| | | | 180/65.1 |

FOREIGN PATENT DOCUMENTS

| | | |
|---|---|---|
| JP | 2013-119326 A | 6/2013 |
| JP | 2014-082167 A | 5/2014 |
| JP | 5740284 B2 | 6/2015 |
| JP | 2017-069034 A | 4/2017 |
| JP | 2019-001190 A | 1/2019 |
| JP | 2020-138693 A | 9/2020 |
| JP | 2020-172225 A | 10/2020 |

\* cited by examiner

INSTALLATION STRUCTURE OF HIGH VOLTAGE ELECTRICAL UNIT ON VEHICLE

TECHNICAL FIELD

The present invention relates to an installation structure of a high voltage electrical unit on a vehicle.

BACKGROUND ART

A patent literature 1 listed below discloses high voltage electrical units installed between a right seat and a left seat of a vehicle. The high voltage electrical units in the above installation structure on a vehicle are units associated with a battery for driving the vehicle, specifically an inverter unit and a direct current to direct current (DC-DC) converter unit. Circuits for the high voltage electrical units (units that use voltages higher than 60 volts) are separated from circuits for low voltage units (units that use voltages not higher than 60 volts [e.g. 12 volt units]), and they also have dedicated negative-side wirings instead of body grounding. Since these high voltage electrical units use high voltages, their protection is important in the event of a vehicle collision.

PRIOR-ART LITERATURE

Patent Literature

Patent Literature 1: Japanese Granted Patent Publication No. 5740284

SUMMARY OF INVENTION

Problem to be Solved by the Invention

In the installation structure disclosed in the Patent Literature 1, the high voltage electrical unit(s) will contacts with a frame of the seat, which is moved to the center of the vehicle upon a side impact to the vehicle. More specifically, the high voltage electrical units are installed inside a battery pack and thereby the seat and the high voltage electrical unit do not directly contact with each other, but a side impact load that is input from the seat to the high voltage electrical unit will act on the high voltage electrical unit(s) through a case of the battery pack. Since the case of the battery pack is used for protecting the high voltage electrical units, a component (the battery pack) other than that is affected by the side impact load input through the seat.

Therefore, an object of the present invention is to provide an installation structure for a high voltage electrical unit on a vehicle that can effectively protect the high voltage electrical unit arranged between left and right seats from a side impact load input through a seat.

Means for Solving the Problem

An aspect of the present invention provides an installation structure for a high voltage electrical unit installed between left and right seats on a vehicle. The structure includes a bracket provided on a floor between the left and right seats, and the high voltage electrical unit is disposed on an upper panel of the bracket. The structure also includes a protect cover that is attached to the bracket and covers over the high voltage electrical unit. Strength of the protect cover against a lateral lord is made higher than strength of the bracket against the lateral road.

Effect of the Invention

According to the aspect, it is possible to protect the high voltage electrical unit arranged between the left and right seats effectively against a side impact load input through the seat.

DESCRIPTION OF EMBODIMENTS

Hereinafter, an installation structure of a high voltage electrical unit on a vehicle according to an embodiment will be explained with reference to the drawings.

Figure 1:
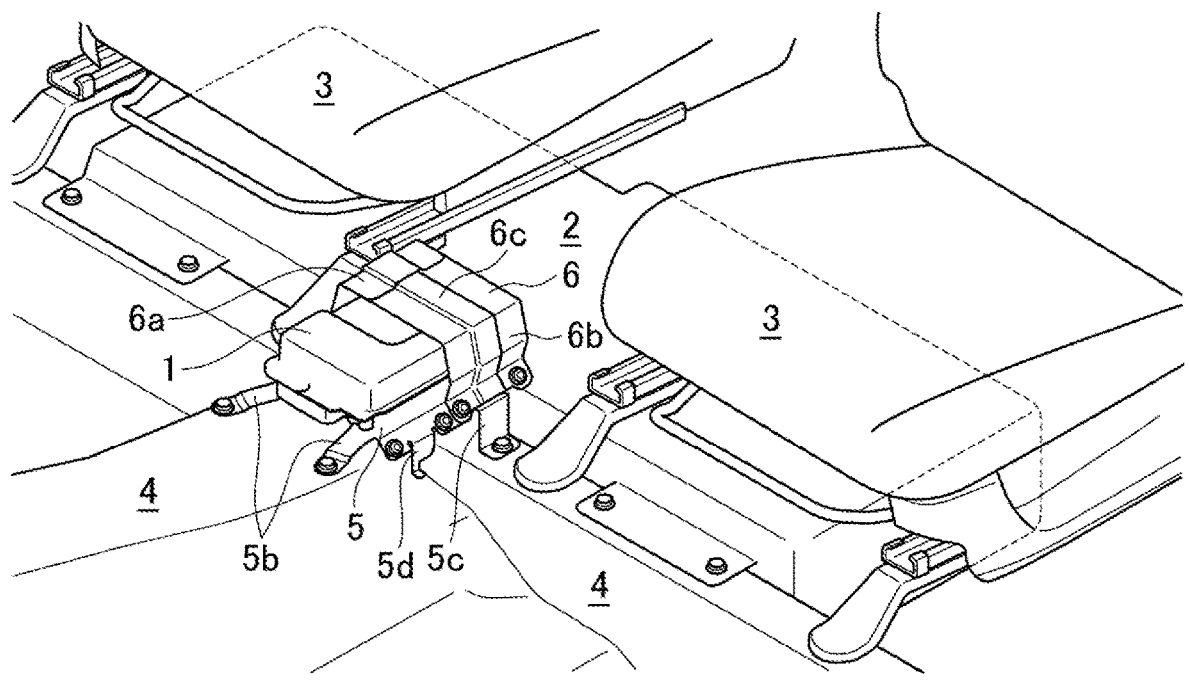
FIG. 1 is perspective view of an installation structure of a high voltage electrical unit on a vehicle according to an embodiment.

The vehicle, on which the high voltage electrical unit 1 of the present embodiment is installed, is a hybrid electric vehicle (an HEV), and a battery pack 2 for running the vehicle is installed thereon with being embedded in a floor 4 beneath left and right seats 3 as shown in FIG. 1. The left and right seats 3 are front seats (a driver's seat and a passenger's seat). The high voltage electrical unit 1 is a DC-DC converter for converting DC voltage of the battery pack 2, and is disposed outside of the battery pack 2.

The high voltage electrical unit 1 (the DC-DC converter) converts the voltage of the electric power output from the battery pack 2, and converts the voltage of the electric power to be input to the battery pack 2. Since the high voltage electrical unit 1 (the DC-DC converter) generates heat when converting the voltage, a heat sink 1a (see FIG. 2) is provided on its bottom.

The high voltage electrical unit 1 is installed between the left and right seats 3. More specifically, a bracket 5 is fixed on the floor 4 between the left and right seats 3, and the high voltage electrical unit 1 is disposed on a bracket top plate 5a of the bracket 5. The high voltage electrical unit 1 is fixed to weld bolts fixed to the bracket top plate 5a by using nuts.

Figure 2:
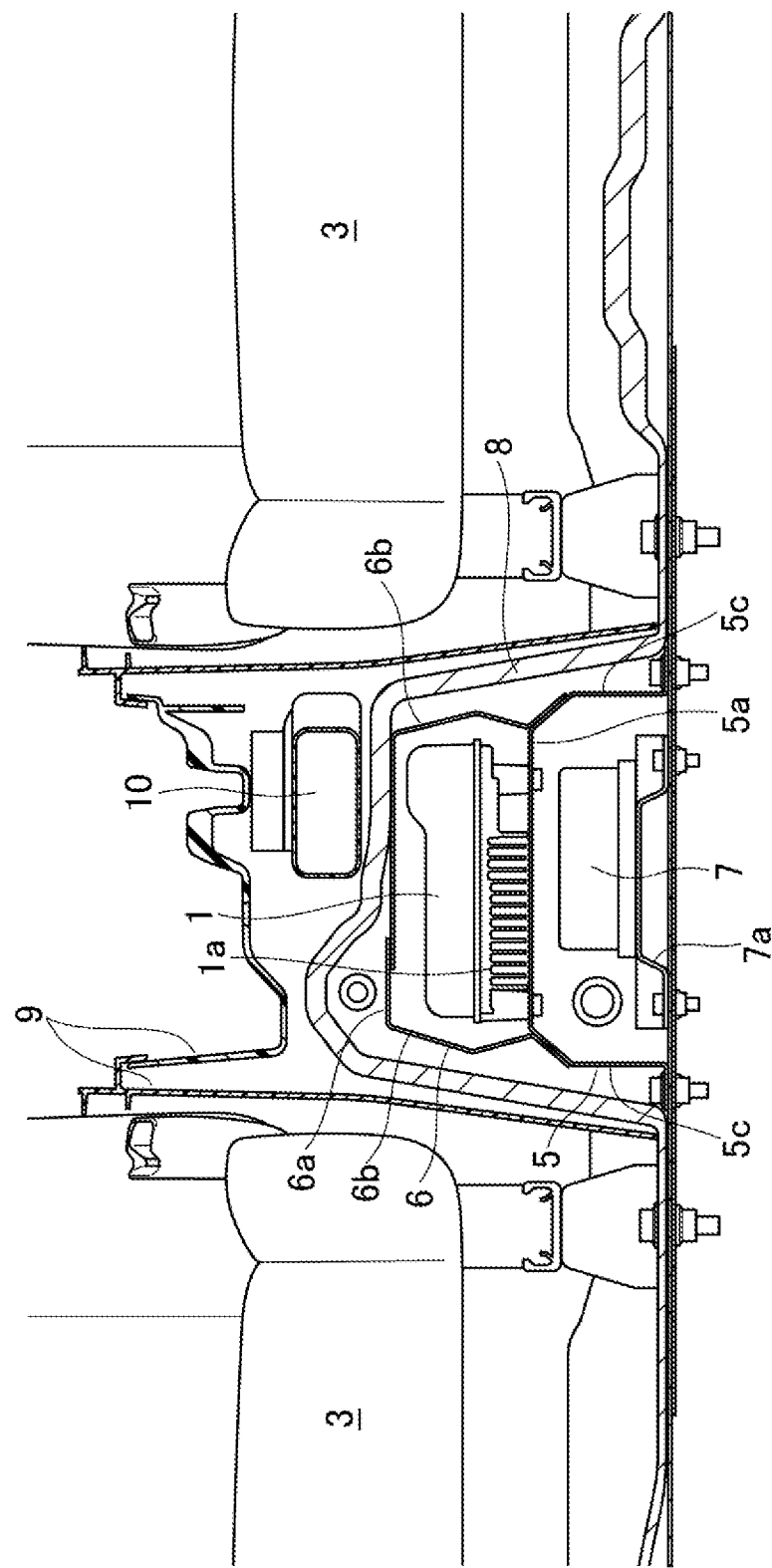
FIG. 2 is a cross-sectional view of the structure.
Figure 3:
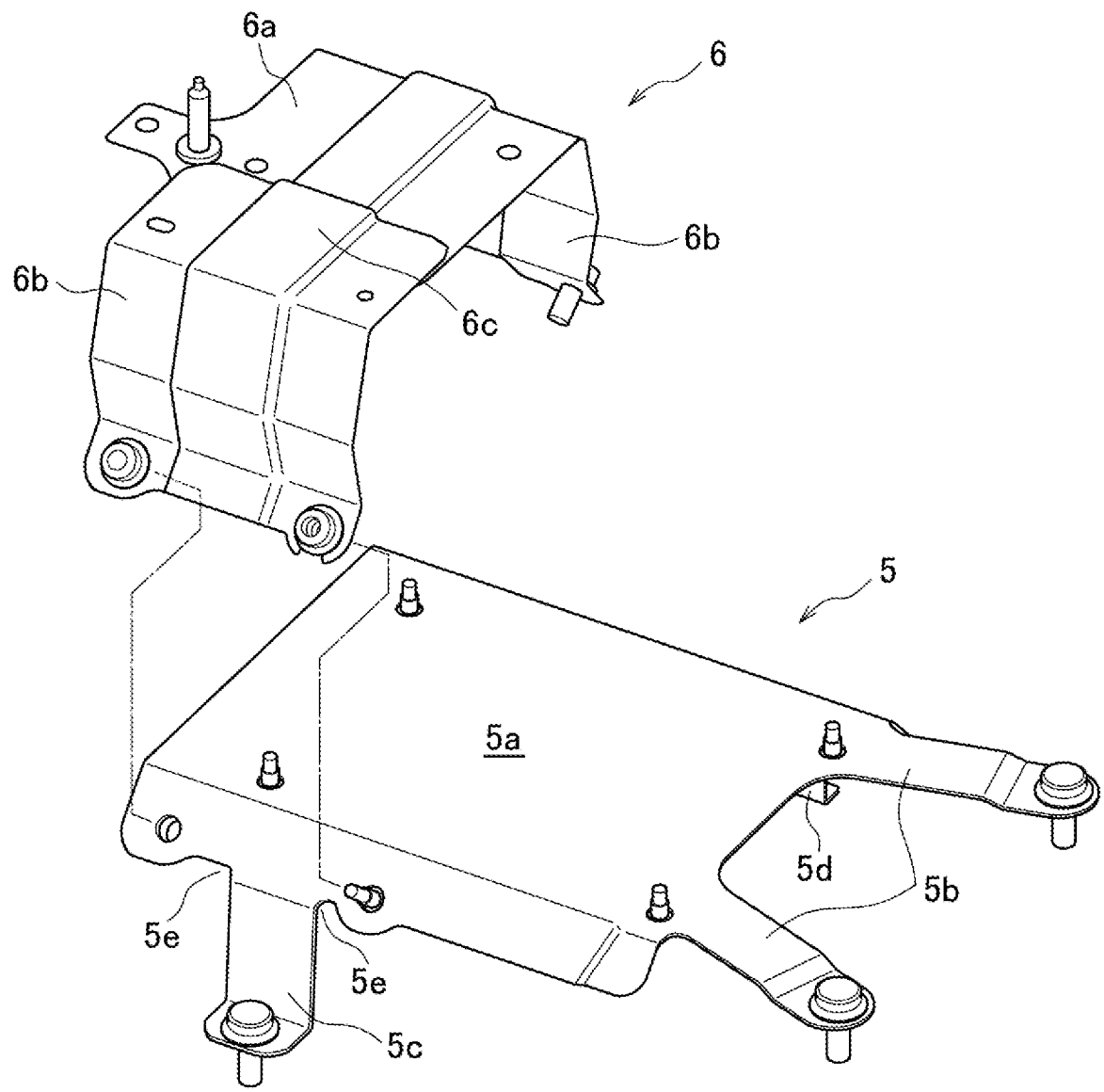
FIG. 3 is an exploded perspective view of a base bracket and a protect cover in the structure.

As shown in FIG. 2 and FIG. 3, the bracket 5 is a press formed metal member having the bracket top plate 5a arranged to form a space between it and the floor 4, and five bracket leg portions 5b, 5c and 5d each of which connects the bracket top plate 5a with the floor 4. The bracket 5 is made of steel material for general structure.

The two bracket leg portions 5b are extended forward from a front edge of the bracket top plate 5a, and the front ends of the bracket leg portions 5b are fixed to a central tunnel (a portion of the floor 4) provided in front of the battery pack 2 by using bolts, respectively. The bracket leg portions 5c are extended downward from each rear portion of both side edges of the bracket top plate 5a, and the lower ends of the bracket leg portions 5c are fixed to the floor 4 by using bolts, respectively.

Note that the bracket leg portion 5d also extends downward from a front portion of the left side edge of the bracket top plate 5a. However, the lower end of the bracket leg portion 5d is only in contact with the floor 4 and is not fixed by using a bolt. In addition, notches 5e are formed adjacent to each connected portion of the bracket leg portions 5c with the bracket top plate 5a.

A protect cover 6, which covers over the high voltage electrical unit 1 and is fixed to the bracket top plate 5*a*, is fixed to the bracket 5. One weld bolt and three weld nuts are fixed to the bracket 5, and the protect cover 6 is fixed to the bracket 5 by using one nut and three bolts.

The protect cover 6 is a press formed metal member having a gate shape with openings at its front and rear. In the present embodiment, the protect cover 6 is formed by jointing two press formed metal members with each other by spot-welding. The protect cover 6 is made of high tensile strength steel plate. A bead 6*c* is formed from cover leg portions 6*b* to a cover top plate 6*a* of the protect cover 6. The protect cover 6 forms a hexagonal space inside when viewed from the front or the rear, and the high voltage electrical unit 1 is placed inside this space. A clearance is formed between the high voltage electrical unit 1 and the protect cover 6 (see FIG. 2).

In the present embodiment, the protect cover 6 does not cover an entire of the high voltage electrical unit 1, but covers at least a portion of it. Specifically, the protect cover 6 covers a portion of the high voltage electrical unit 1 so as to cover an area overlapping an internal structure (a seat frame) of the seat(s) 3 capable of sliding back and forth.

As explained above, the space is formed between the bracket top plate 5*a* and the floor 4, and an airbag control unit 7 is fixed to the floor 4 in this space. In more detail, the airbag control unit 7 is fixed to the floor 4 via a fixing bracket 7*a*.

An acceleration sensor is built in the airbag control unit 7. The acceleration sensor detects acceleration (deceleration) that occurs in the vehicle, and a vehicle collision is detected based on the detected acceleration (deceleration). When a vehicle collision is detected, the airbag control unit 7 outputs a deployment command to an airbag module(s) that is to be deployed.

In order to detect a vehicle collision, it is preferable that an acceleration sensor is installed on the floor in the center of the vehicle, so the airbag control unit 7 is fixed on the floor 4 between the left and right seats 3. Note that satellite acceleration sensors may be installed on side portions of the vehicle to detect a side impact earlier, upon which a sufficient body crushable stroke cannot be ensured. These satellite acceleration sensors are also connected to the airbag control unit 7.

An entire of the installation structure of the high voltage electrical unit 1 (and the airbag control unit 7) on the vehicle, which is constructed as a two floor structure as explained above, is covered by a floor mat 8. Insertion holes, through which harnesses led out from the high voltage electrical unit 1 and the airbag control unit 7 are passed, are also formed on the floor mat 8. Although it will be explained later, the floor mat 8 also functions as a sound absorbing material for absorbing noisy sound (such as high-frequency sound) generated by the high voltage electrical unit 1.

The installation structure of the high voltage electrical unit 1 (and the airbag control unit 7), which is covered by the floor mat 8, is further covered by a center console box 9 in addition to the floor mat 8. In other words, the installation structure of the high voltage electrical unit 1 (and the airbag control unit 7) is built inside the center console box 9. Note that a duct 10 connected to an air conditioner outlet for rear seats and so on are also built in the center console box 9 in addition to the above-mentioned harnesses.

As explained above, the protect cover 6 is formed of high tensile strength steel plate and has the above-mentioned bead 6*c*. On the other hand, the bracket 5 is made of steel plate for general structure and has the above-mentioned notches 5*e*. Therefore, the strength of the protect cover 6 against a lateral load is higher than the strength of the bracket 5 against the lateral load. The steel plate for general structure mentioned here refers to a steel plate with a tensile strength of 270 MPa or higher, and the high tensile strength steel plate mentioned here refers to a steel plate with a tensile strength of 340 MPa to 790 MPa.

Figure 4:
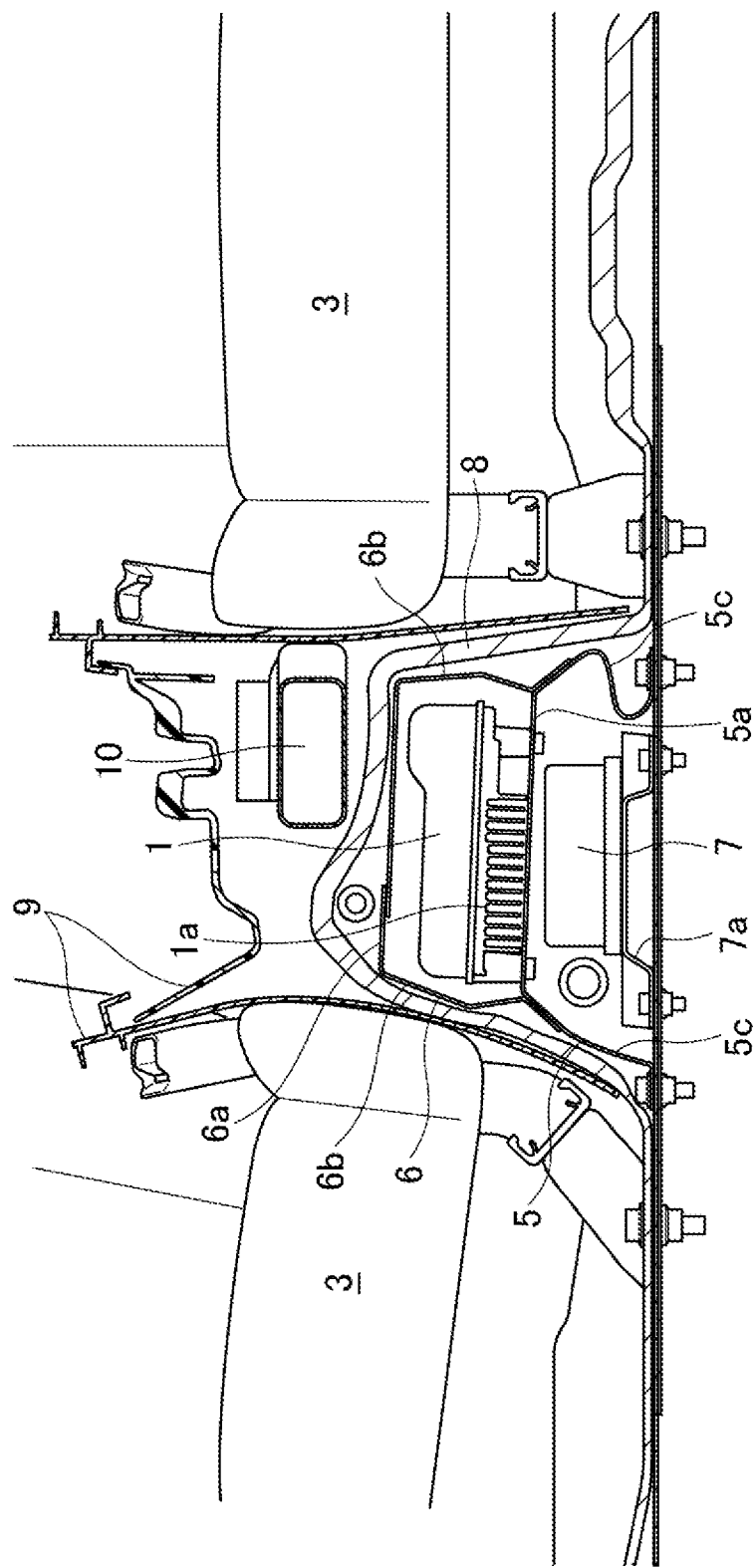
FIG. 4 is a cross-sectional view of the structure upon a side impact.

Next, a state of the above-explained installation structure upon a side impact will be explained with reference to FIG. 4. In contrast to FIG. 2 showing a state of the installation structure under a normal condition, FIG. 4 shows the state of the installation structure upon a side impact on the right side of the vehicle.

Due to the side impact on the right side of the vehicle, the right side of the vehicle body including a B-pillar enters into a passenger compartment, and then moves the right seat 3 to the center of the vehicle. Although the right seat 3 does not removed from its seat rail, the internal structure (the seat frame) of the moved right seat 3 laterally pushes the installation structure together with the center console box 9 and the floor mat 8 interposed therebetween. Since the strength of the protect cover 6 against a lateral load is higher than that of the bracket 5 as explained above, the bracket leg portions 5*c* of the bracket 5 deform and thereby absorb the lateral load in the installation structure on which the lateral load acts.

Since the protect cover 6 is made of high tensile strength steel plate and the bead 6*c* is formed thereon, it substantially maintains its hexagonal closed cross-section formed by it together with the bracket top plate 5*a* of the bracket 5. The clearance formed between the high voltage electrical unit 1 and the protect cover 6 is also maintained. Therefore, the side impact load does not act directly onto the high voltage electrical unit 1 covered by the protect cover 6, and thereby the high voltage electrical unit 1 is securely protected.

Note that the protect cover 6 also prevents radiation of the above-mentioned noisy sound generated by the high voltage electrical unit 1 (the DC-DC converter). In the present embodiment, the radiated noisy sound is also absorbed by the floor mat 8. When the vehicle is running only by the motor using the electrical power of the battery pack 2 (electrical power is not generated by the internal combustion engine, either), no noisy sound is generated by the internal combustion engine. Therefore, the noisy sound generated by the high voltage electrical unit 1 installed between the seats 3 in the passenger compartment may be easily recognized by occupants. But, the protect cover 6 suppresses the noisy sound.

In addition, as explained above, the high voltage electrical unit 1 (the DC-DC converter) also generates heat, so the high voltage electrical unit 1 is equipped with the heat sink 1*a*. Furthermore, the heat generated by the high voltage electrical unit 1 is transferred from a base plate of the high voltage electrical unit 1 to the bracket 5, the protect cover 6 and the floor 4 through the bracket top plate 5*a* of the bracket 5. That is, the bracket 5, the protect cover 6 and the floor 4 that are made of metal can also function as heat radiation members.

According to the present embodiment, since the strength of the protect cover 6 against a lateral load is higher than the strength of the bracket 5 against the side load, the high voltage electrical unit 1 can be effectively protected from a side impact load (the lateral load) input through the seat 3. At the moment, this protection of the high voltage electrical unit 1 does not make a component other than it (such as the battery pack 2) affected by the side impact load input through the seat 3.

Note that, in the above-mentioned Patent Literature 1, a reinforcing member is provided to protect the high voltage electrical unit from a lateral load. However, such an installation of the reinforcing member increases weight, but the installation structure according to the present embodiment can protect the high voltage electrical unit 1 while absorbing a lateral load without installing any special reinforcing member.

In addition, according to the present embodiment, the clearance is formed between the high voltage electrical unit 1 and the protect cover 6. Therefore, the side impact load is not directly input to the high voltage electrical unit 1 and thereby the high voltage electrical unit 1 is protected more securely.

In addition, according to the present embodiment, the high voltage electrical unit 1 is the DC-DC converter that converts the DC voltage of the battery pack 2, which is installed outside the battery pack 2 for running the vehicle. Therefore, upon a side impact, the battery pack 2 is not affected by this protection of the high voltage electrical unit 1. Further, the protect cover 6 can suppress the sound generated by the DC-DC converter. Furthermore, the heat generated by the DC-DC converter can be released from an entire of the installation structure.

In addition, according to the present embodiment, the protect cover 6 is formed by high tensile strength steel plate and the bracket 5 is formed by steel for general structure. Therefore, in terms of material, the strength of the protect cover 6 against a lateral load is made higher than the strength of the bracket 5 against the lateral load, so that the high voltage electrical unit 1 can be effectively protected from a side impact load (the lateral load) input through the seat 3.

In addition, according to the present embodiment, the bead 6c is formed from the cover leg portions 6b to the cover top plate 6a in the protect cover 6, which is a press formed metal member, to provide high rigidity to the protect cover 6. On the other hand, the notches 5e are formed adjacent to each connected portion of the bracket leg portions 5c and the bracket top plate 5a in the bracket 5, which is a press formed metal member, to form vulnerable portions in the bracket 5. By making the strength of the protect cover 6 against a lateral load higher structurally than the strength of the bracket 5 against the lateral load, the high voltage electrical unit 1 can be effectively protected from a side impact load (the lateral load) input through the seat 3.

Furthermore, according to the present embodiment, the airbag control unit 7 is fixed to the floor 4 in the above-mentioned space formed by the bracket 5. It is preferable for detecting collision that the airbag control unit 7 is fixed on the floor 4 between the left and right seats 3. Therefore, by this configuration, the high voltage electrical unit 1 and the airbag control unit 7 can be installed in a space-efficient manner.

REFERENCE SIGNS LIST 1 high voltage electrical unit (DC-DC converter)
2 battery back
3 seat
4 floor
5 bracket
5a bracket top plate
5b-5d bracket leg portion
5e notch
6 protect cover
6a cover top plate
6b cover leg portion
6c bead
7 airbag control unit

The invention claimed is:

1. An installation structure of a high voltage electrical unit on a vehicle, which is installed between left and right seats, the structure comprising:
 a bracket provided on a floor between the seats,
  wherein the high voltage electrical unit is disposed on a bracket top plate of the bracket; and
 a protect cover attached to the bracket to cover at least a portion of the high voltage electrical unit,
 wherein a strength of the protect cover against a lateral load is higher than a strength of the bracket against the lateral load, and
 wherein the protect cover and the bracket are fixed and wholly disposed between the right and left seats.

2. The installation structure of the high voltage electrical unit on the vehicle according to claim 1,
 wherein a clearance is formed between the high voltage electrical unit and the protect cover.

3. The installation structure of the high voltage electrical unit on the vehicle according to claim 1,
 wherein the high voltage electrical unit is a direct current to direct current (DC-DC) converter that is disposed outside of a battery pack for running the vehicle and converts DC voltage of the battery pack.

4. The installation structure of the high voltage electrical unit on the vehicle according to claim 1,
 wherein the protect cover is formed by high tensile strength steel, and
 wherein the bracket is formed by steel for general structure.

5. The installation structure of the high voltage electrical unit on the vehicle according to claim 1,
 wherein the protect cover is a press formed metal member having a gate shape with openings at a front and a rear thereof,
 wherein a bead is formed from cover leg portions to the cover top plate of the protect cover,
 wherein the bracket is a press formed metal member having a bracket top plate arranged to form a space between the bracket top plate and the floor, and a plurality of bracket leg portions each of which connects the bracket top plate to the floor, and
 wherein notches are formed adjacent to each connected portion of the bracket leg portions with the bracket top plate.

6. The installation structure of the high voltage electrical unit on the vehicle according to claim 5,
 wherein an airbag control unit is fixed on the floor in the space formed by the bracket.

7. The installation structure of the high voltage electrical unit on the vehicle according to claim 1, wherein the bracket top plate is disposed above the floor and between the left and right seats.

8. The installation structure of the high voltage electrical unit on the vehicle according to claim 1, wherein the high voltage electrical unit is fixed and supported on the bracket top plate and disposed between the left and right seats.

9. The installation structure of the high voltage electrical unit on the vehicle according to claim 1, wherein the bracket includes a plurality of bracket leg portions each of which extends downward from the bracket top plate and is connected to the floor.

* * * * *